United States Patent [19]
Kojima et al.

[11] Patent Number: 5,723,900
[45] Date of Patent: Mar. 3, 1998

[54] RESIN MOLD TYPE SEMICONDUCTOR DEVICE

[75] Inventors: Akira Kojima; Haruhiko Makino; Kenji Ohsawa, all of Kanagawa, Japan

[73] Assignee: Sony Corporation, Tokyo, Japan

[21] Appl. No.: 799,497

[22] Filed: Feb. 12, 1997

Related U.S. Application Data

[63] Continuation of Ser. No. 299,646, Sep. 2, 1994, abandoned.

[30] Foreign Application Priority Data

Sep. 6, 1993 [JP] Japan .................................... 5-221414

[51] Int. Cl.[6] .................................................. H01L 23/495
[52] U.S. Cl. .......................... 257/666; 257/686; 257/692; 257/787
[58] Field of Search .................................... 257/787, 666, 257/686, 684, 700, 784, 692, 691

[56] References Cited

U.S. PATENT DOCUMENTS 5,157,475 10/1992 Yamaguchi ............................ 257/787
5,519,251 5/1996 Sato et al. ............................. 257/778

FOREIGN PATENT DOCUMENTS 61-101067 5/1986 Japan .................................... 257/686
4-96357 3/1992 Japan .................................... 257/691

*Primary Examiner*—Tom Thomas
*Assistant Examiner*—Roy Potter
*Attorney, Agent, or Firm*—Hill, Steadman & Simpson

[57] ABSTRACT

A ultra thin resin mold semiconductor device can be provided. A resin mold type semiconductor device is arranged so that a semiconductor chip is disposed within a range of the thickness of a lead frame and sealed with a resin mold, that the thickness of the semiconductor device is defined by the thickness of the lead frame, and that an upper surface, a lower surface and a side surface of a terminal portion formed by the lead frame are exposed from the surface of the resin mold.

16 Claims, 8 Drawing Sheets

RESIN MOLD TYPE SEMICONDUCTOR DEVICE

This is a continuation of application Ser. No. 08/299,646, filed Sep. 2, 1994 now abandoned.

BACKGROUND OF THE INVENTION

1. Field of the Invention

The present invention relates to thin resin mold type electronic devices, such as a semiconductor device.

2. Description of the Related Art

As a resin mold type semiconductor device, there is a semiconductor device including a lead frame in which an electrode of a semiconductor chip is interconnected to the tip end of an inner lead of the lead frame by some suitable means, such as a metal interconnection (e.g., Au interconnection) or the like according to resin molding.

There is a semiconductor device in which a TAB (tape automated bonding) lead composed of a polyimide film base and a copper foil lead formed on the surface of the polyimide film base is directly interconnected to an electrode pad of a semiconductor chip.

Further, there is a semiconductor device in which a bump is formed on the tip end of an inner lead of a lead frame and the bump is interconnected to the electrode of the semiconductor chip.

As the aforementioned semiconductor device of the type such that the bump is formed on the tip end of the inner lead of the lead frame, there is a semiconductor device which includes a lead frame of a trilayer structure.

FIG. 1 of the accompanying drawings shows a structure of a resin mold type semiconductor device 10 including a lead frame of a trilayer structure in a cross-sectional fashion.

In FIG. 1, reference numeral 1 designates a semiconductor chip, 2 a lead frame, 3 an outer lead of the lead frame, 4 an inner lead, and 5 a mold resin. The lead frame 2 is made by a trilayer cladding member 6 composed of an outer-lead metal layer 6a made of suitable material, such as copper, iron-nickel alloy (42-alloy) or the like, an intermediate layer 6b made of aluminum, for example, and an inner-lead metal layer 6c made of copper, for example. The outer lead 3 is formed from the metal layer 6a, the inner leads 4 is formed from the metal layer 6c, and a bump 7 is formed from the intermediate layer 6b on the tip end of the inner lead by patterning the cladding member 6 by etching, respectively.

An electrode pad 8 made of, for example, aluminum is formed on the surface of the semiconductor chip 1, and the electrode pad 8 is interconnected to the bump 7 on the tip end of the inner lead 4 by ultrasonic bonding. In this state, the semiconductor chip 1 and the inner lead 4 are hermetically molded with a resin 5. After the lead of the lead frame 2 is processed, a solder-plating layer 9 is formed on the front and rear surfaces of the outer lead 3.

Because the resin mold type semiconductor device 10 shown in FIG. 1 includes the bump 7 formed on the tip end of the inner lead 4, the semiconductor chip 1 can be supported by a plurality of inner leads 4. Therefore, the semiconductor device can be made thin without die pad.

Since however the semiconductor chip 1 and the inner leads 4 are buried in the mold resin 5 and the outer lead 3 is bent in one direction, the direction in which this semiconductor device is mounted on the circuit board, i.e., the soldering direction is fixedly limited to one direction.

Furthermore, the semiconductor device 10 cannot be assembled by laminating and soldering.

SUMMARY OF THE INVENTION

It is, therefore, an object of the present invention to provide a resin mold type semiconductor device which can be made thin and which can be assembled by laminating and mounted on the circuit board from the directions of both front and rear surfaces.

According to the present invention, there is provided a resin mold type semiconductor device in which a semiconductor chip is disposed within a range of a thickness of a lead frame and sealed with resin mold.

According to the present invention, there is provided a resin mold type semiconductor device in which a thickness of the semiconductor device is defined by a thickness of the lead frame.

According to the present invention, there is provided a resin mold type semiconductor device in which an upper surface, a lower surface and a side surface of the terminal portion formed by the lead frame are exposed from the surface of the resin mold.

According to the present invention, there is provided a resin mold type semiconductor device in which the semiconductor chip is interconnected to an interconnection lead portion thinner than the terminal portion integrally led out from the terminal portion.

According to the present invention, since the semiconductor chip is disposed within a range of the thickness of the lead frame and sealed with resin mold, the resin mold type semiconductor device can be made thin.

According to the present invention, since the thickness of the resin mold semiconductor device is defined by the thickness of the lead frame, the resin mold type semiconductor device can be made thin with flat front and rear surfaces.

Further, according to the present invention, since the upper surface, the lower surface, and the side surface of the terminal portion formed by the lead frame are exposed from the surface of the resin mold in the resin mold semiconductor device, the resin mold type semiconductor device can be mounted on a circuit board from both directions of the frond and rear surfaces. Further, a plurality of such resin mold type semiconductor devices can be assembled and mounted on the circuit board by laminating.

Furthermore, according to the present invention, since the semiconductor chip is interconnected to the interconnection lead portion thinner than the terminal portion led out integrally from the terminal portion, the resin mold type semiconductor device can be made thin.

DETAILED DESCRIPTION OF THE PREFERRED EMBODIMENTS

Embodiments of the present invention will now be described with reference to the drawings.

Figure 1:
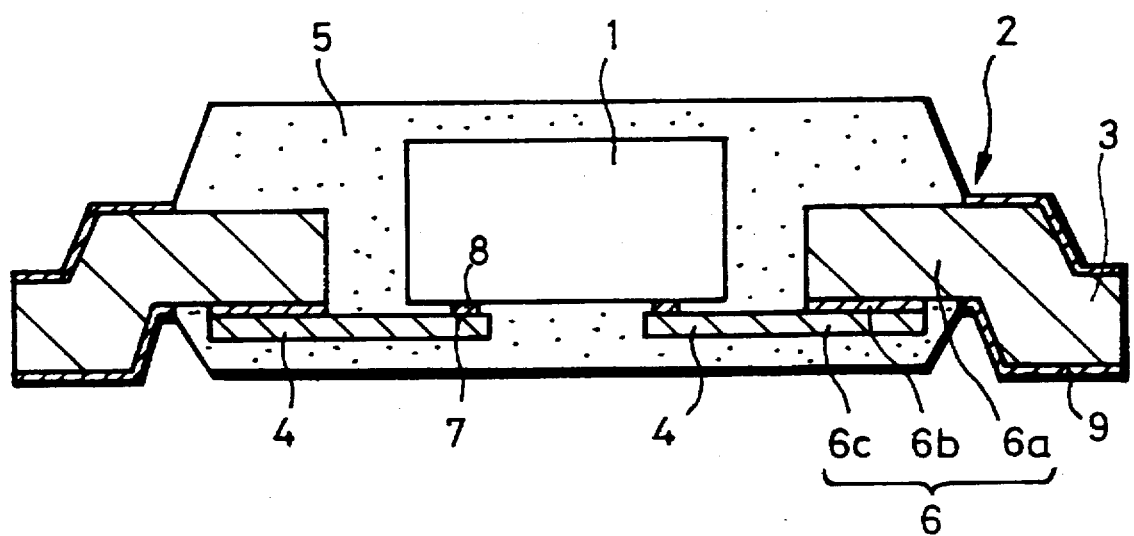
FIG. 1 is a cross-sectional view showing a resin mold type semiconductor device.
Figure 2:
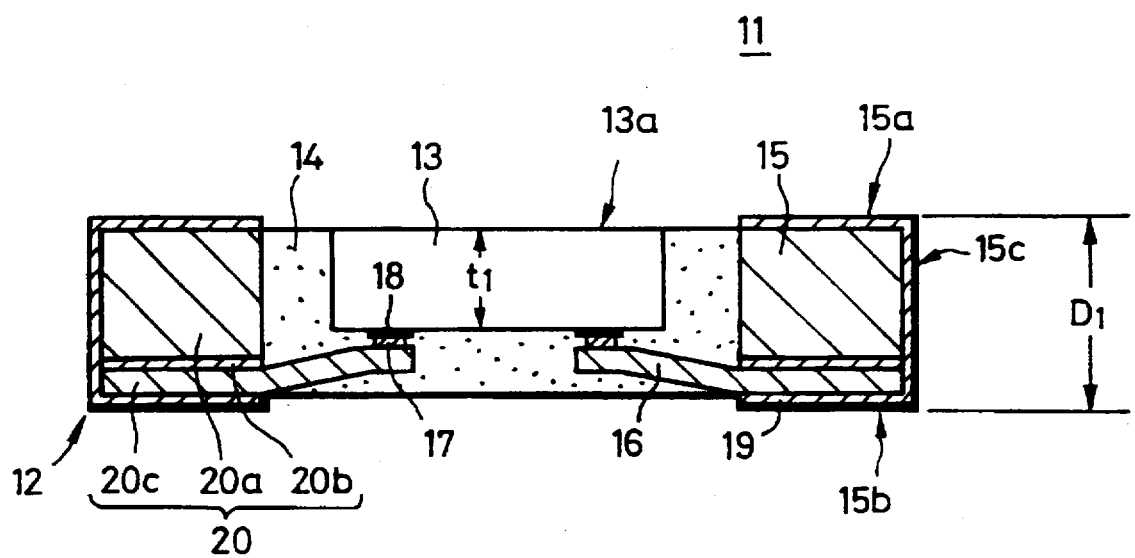
FIG. 2 is a cross-sectional view showing a resin mold type semiconductor device according to a first embodiment of the present invention.
Figure 3:
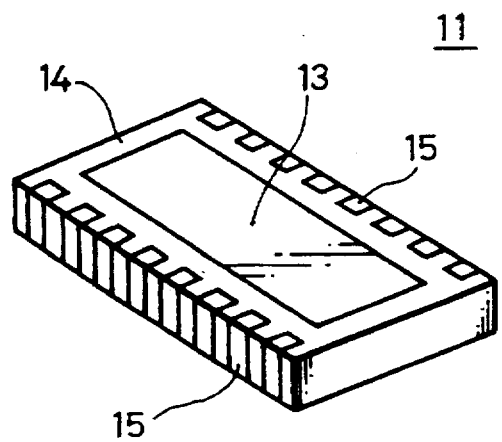
FIG. 3 is a perspective view of the resin mold type semiconductor device shown in FIG. 2.

FIGS. 2 and 3 are a cross-sectional view and a perspective view of the resin mold type semiconductor device according to a first embodiment of the present invention as an example of a resin mold type electronic device, respectively.

In the resin mold type semiconductor device 11 according of this embodiment, a semiconductor chip 13 is disposed within a range of a thickness $D_1$ of a lead frame 12 and molded or sealed with resin 14 so that the total thickness of the semiconductor device 11 is defined by the thickness $D_1$.

The lead frame 12 is constituted by a trilayer cladding material 20 composed of a metal layer 20a for an outer lead made of, for example, copper, iron-nickel alloy (42-alloy) or the like having a thickness between 100 μm and 150 μm, an intermediate layer 20b made of, for example, aluminum having a thickness between 5 μm and 20 μm, and a metal layer 20c for an inner lead made of, for example, copper having a thickness between 5 μm and 30 μm. The cladding material 20 is partly etched away by patterning so that an outer lead 15 is formed by the metal layer 20a, an inner lead 16 is formed by the metal layer 20c, and a bump 17 is formed by the intermediate layer 20b on the tip end of the inner lead 16, respectively.

The inner lead 16 is bent inward so that it exists within a range of the plate thickness $D_1$ of the lead frame 12 or outer leads 15, and the bump 17 on the tip end of the inner lead 16 is joined by, for example, ultrasonic energy with an aluminum electrode pad 18 formed on the surface of the semiconductor chip 13.

After molding with the resin 14, a rear surface 13a of the semiconductor chip 13 is ground so as to be flush with the upper surface of the outer lead 15, so that the rear surface 13a of the semiconductor chip 13 is flush with the surface of the mold resin 14 and exposed.

Thus, the thickness $t_1$ of the semiconductor chip 13 is formed thinner than the thickness $D_1$ of the outer leads 15.

The outer lead 15 is cut approximately along the end surface of the mold resin 14 so as to form a so-called terminal portion. Accordingly, the outer lead 15 according to this embodiment is not the conventional outer lead which is led out from a mold resin but is substantially buried in the mold resin 14 as shown in FIG. 3. Thus, the outer lead 15 according to this embodiment may constitute a part of the inner lead from a conventional concept standpoint. The outer lead 15 will be referred to hereinafter as a terminal portion.

The terminal portion 15 is exposed to the outside on its upper, lower and side surfaces 15a, 15b and 15c from the surface of the resin mold 14, and the exposed upper, lower and side surfaces 15a, 15b and 15c are coated, for example, with a solder-plating layer 19 of, for example, a thickness between 3 μm and 10 μm. Thus, the terminal portion 15 slightly projects from the surface of the mold resin 14 by the solder-plating layer 19.

FIGS. 4A to 4J show an example of the manufacturing process of the resin mold type semiconductor device 11 according to the first embodiment of the present invention.

Figure 4A:
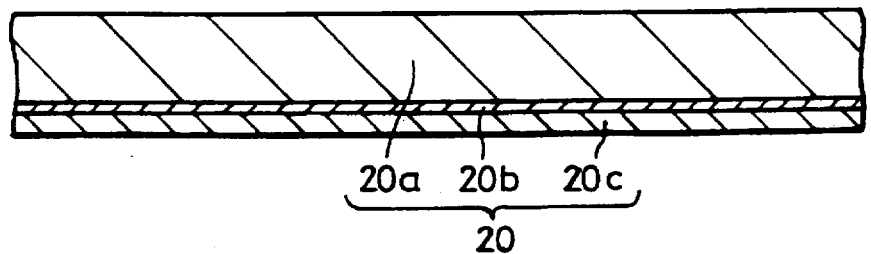
FIGS. 4A to 4J are cross-sectional views showing a manufacturing method of the resin mold type semiconductor device according to the first embodiment of the present invention.

Initially, as shown in FIG. 4A, there is provided the cladding member to be formed into the lead frame 12, i.e., a cladding member 20 of a trilayer structure which is composed of the copper member 20a for the outer lead, the aluminum member 20b for the intermediate layer, and the copper member 20c for the inner leads.

Figure 4B:
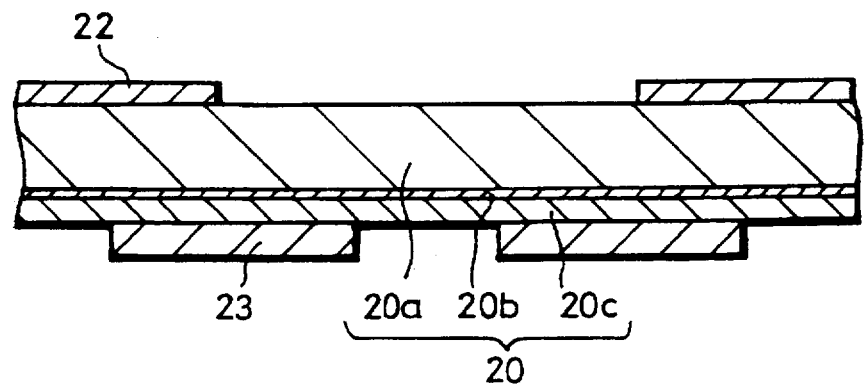

Next, as shown in FIG. 4B, a photoresist layer 22 of a pattern corresponding to the shape of the lead frame including the outer leads and a photoresist layer 23 of a pattern corresponding to the shape of the inner leads are formed on the upper and lower surfaces of the cladding member 20, respectively.

Figure 4C:
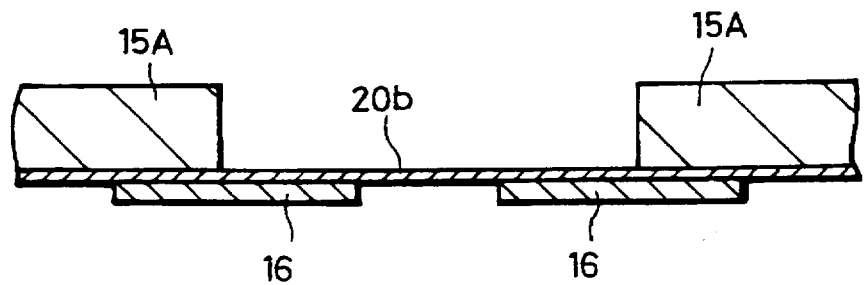

Then, the copper materials 20a and 20c are selectively etched away by using the photoresist layers 22 and 23 as masks, respectively, so that, as shown in FIG. 4C, an outer lead 15A (including a die bar, an outer frame, etc. ) and an inner lead 16 interconnected to the outer lead 15A are formed with the aluminum member 20b for the intermediate layer sandwiched therebetween. In this case, the aluminum member 20b for the intermediate layer serves as an etching stopper.

Figure 4D:
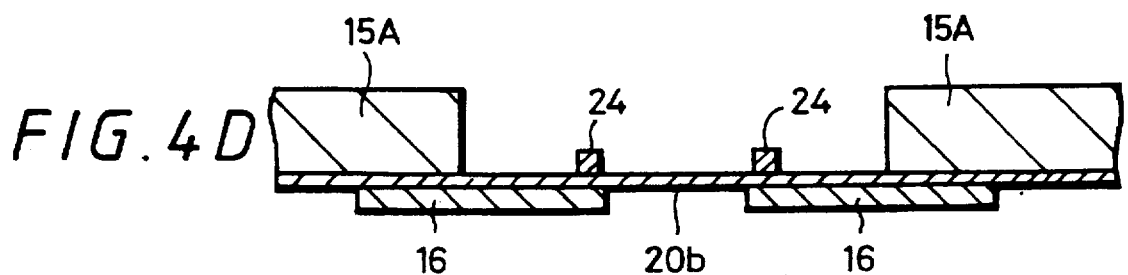

Next, as shown in FIG. 4D, a photoresist layer 24 of a pattern corresponding to the bump is formed on the aluminum member 20b which corresponds to the tip end of the inner lead 16. Then, as shown in FIG. 4E, the aluminum member 20b is selectively removed to form the bump 17 of aluminum on the tip end of the inner lead 16.

Figure 4E:
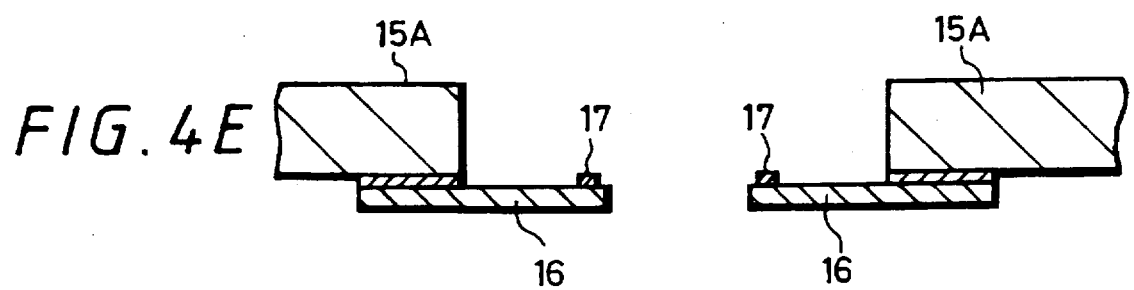
Figure 4F:
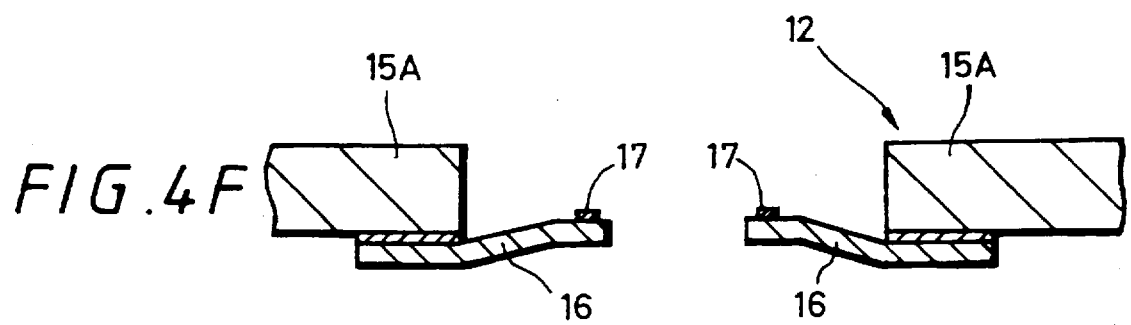

Next, as shown in FIG. 4F, the inner lead 16 is bent inward so that the inner lead 16 exists within a range of the thickness of the outer lead 15A, thereby completing the lead frame 12 used in the embodiment.

Figure 4G:
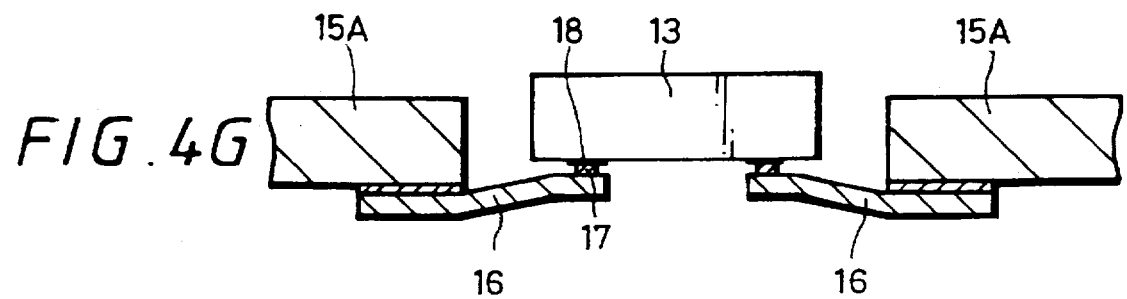
Figure 4H:
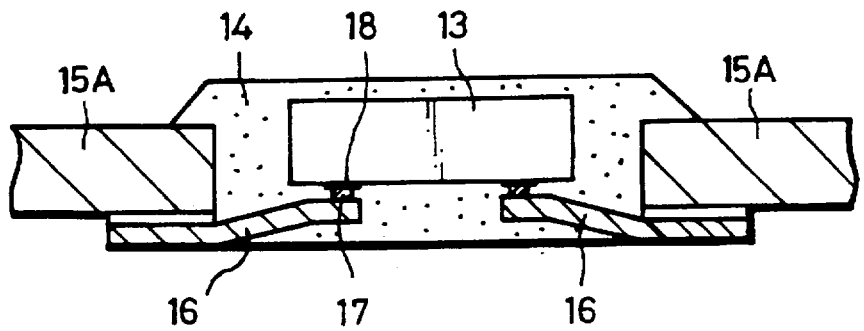

Then, as shown in FIG. 4G, the semiconductor chip 13 is disposed on the inner lead 16 of the lead frame 12, and the bump 17 formed on the tip end of the inner lead 16 is joined with the aluminum electrode pad 18 formed on the semiconductor chip 13 through ultrasonic bonding.

Next, as shown in FIG. 4E, the semiconductor chip 13 and the inner lead 16 are molded with the resin 14 so as to be buried thereby. In this state, the semiconductor chip 13 and the mold resin 14 project out from the surface of the outer lead 15A.

Figure 4I:
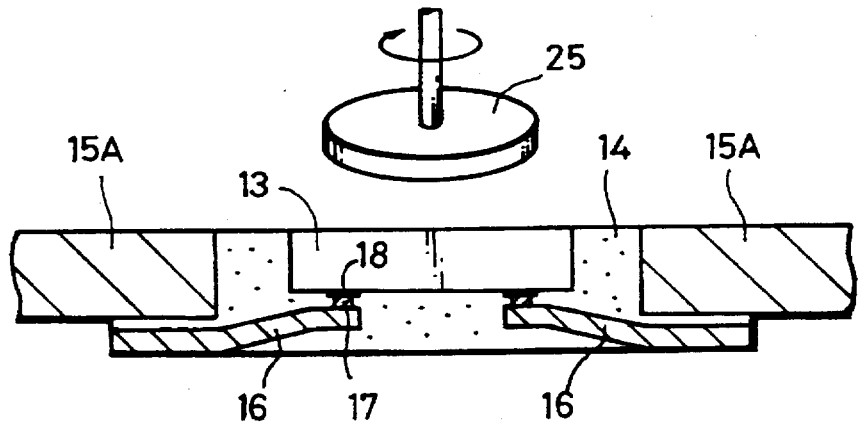

Then, as shown in FIG. 4I, the projecting rear surfaces of the mold resin 14 and semiconductor chip 13 are ground by means of a grinding device 25 until the rear surfaces become flush with the surface of the outer leads 15A.

The semiconductor chip 13 may be ground to a limit where it satisfies its function.

Figure 4J:
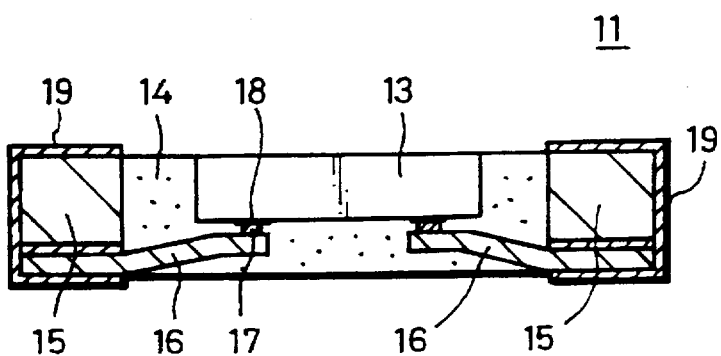

Next, lead working process of the lead frame 12 is carried out. That is, the die bar and outer frame for preventing the mold resin 14 from flowing are cut and the outer leads 15A are cut at the position along the end surface of the mold resin 14. Then, the solder-plating layer 19 is formed through barrel plating, chemical plating, vacuum evaporation or the like, on the remaining portions of the outer leads, i.e., on the exposed upper, lower and side surfaces of the terminal portion 15 to thereby obtain such an objective ultra thin, small-sized resin mold type semiconductor device 11 as shown in FIG. 4J.

In the lead working process, for example, the die bar of the lead frame 12 and a so-called resin burr between the outer leads 15A may be cut or ground and the outer leads 15A may be cut along the end surface of the resin 14.

Alternatively, after the die bar of the lead frame 12 is cut, the outer lead 15A may be cut along the end surface of the resin 14 in the state where the resin burr portion is left. In this case, the terminal portion can be formed longer so that soldering at the succeeding step may be carried out in the excellent state.

Figure 5:
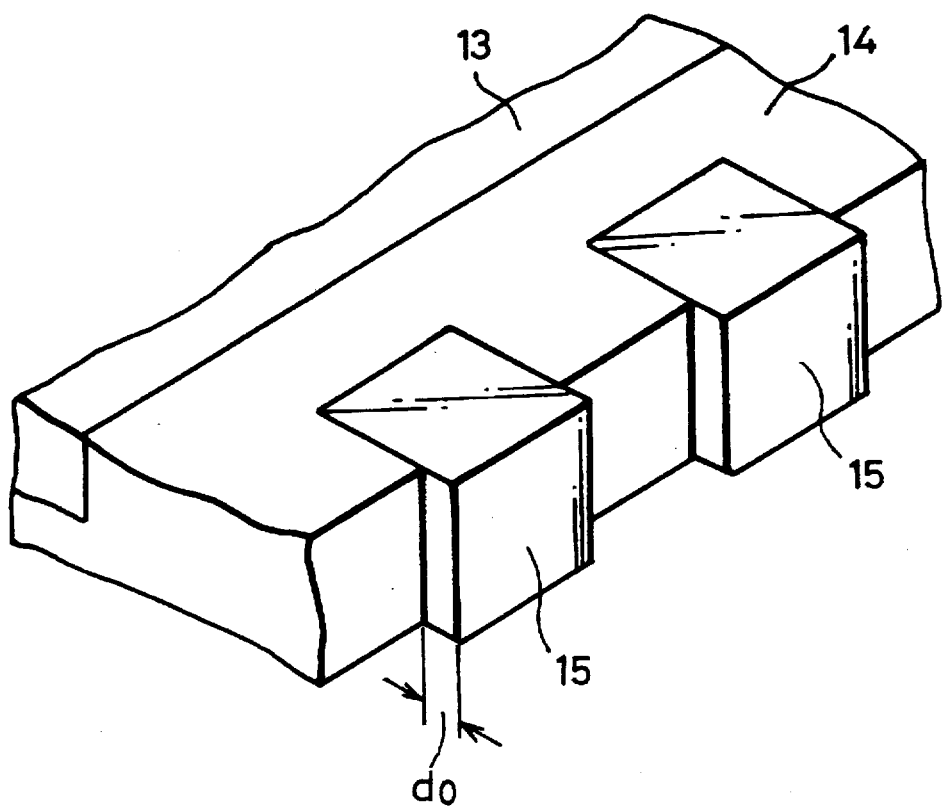
FIG. 5 is a perspective view showing a main portion of the resin mold type semiconductor device according to the first embodiment of the present invention, and to which reference will be made in explaining a manufacturing method thereof.

In the cutting process of the outer lead 15A, the outer lead 15A is cut so that the outer lead 15A projects out slightly from the end surface of the resin 14 by a length $d_o$ (for example, $d_o$ is selected to be about 0.1 mm) as shown in FIG. 5.

In the resin mold type semiconductor device 11 according to the above-mentioned embodiment, since the semiconductor chip 13 is buried within a range of the thickness of the lead frame 12, i.e., the thickness $D_1$ of the terminal portion 15 so that the total thickness of the semiconductor device 11 is defined by the thickness of the lead frame 12, it is possible to obtain an ultra thin, small-sized resin mold type semiconductor device.

Figure 6:
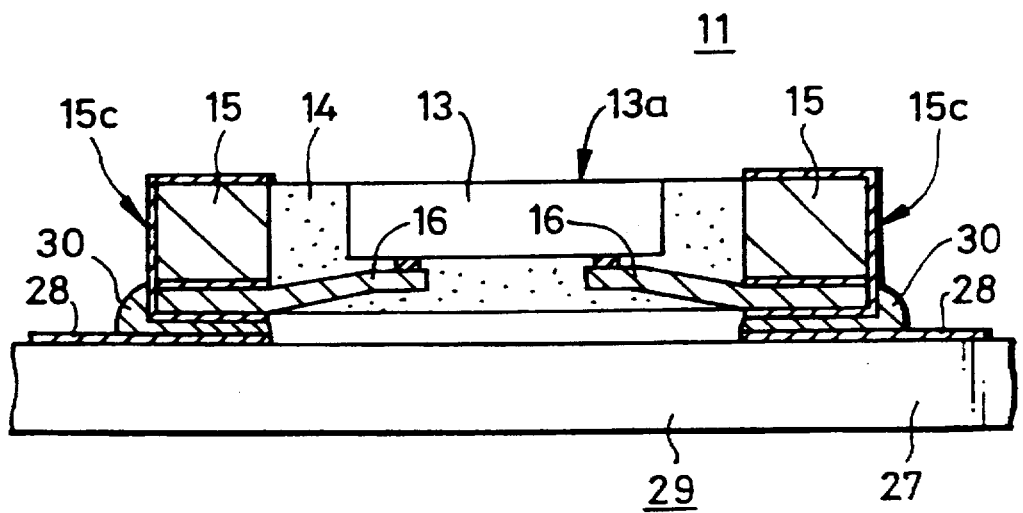
FIG. 6 is a cross-sectional view of the resin mold type semiconductor device according to a second embodiment of the present invention, and to which reference will be made in explaining how to mount the resin mold type semiconductor device on the circuit board.
Figure 7:
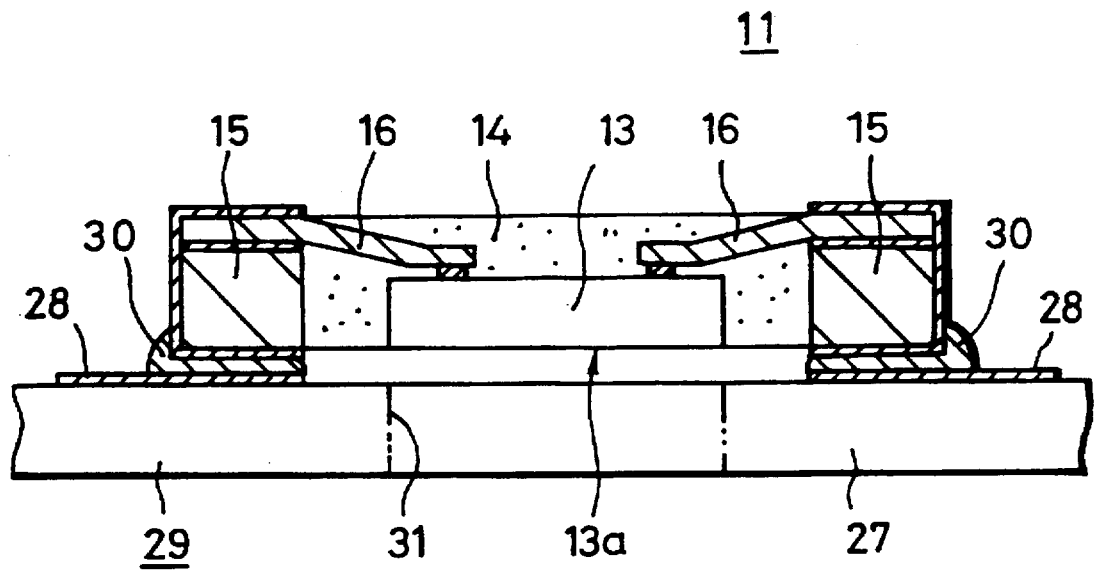
FIG. 7 is a cross-sectional view of the resin mold type semiconductor device according to a third embodiment of the present invention, and to which reference will be made in explaining how to mount the resin mold type semiconductor device on the circuit board.

In this resin mold type semiconductor device 11, since the upper, lower and side surfaces 15a, 15b and 15c of the terminal portion 15 are exposed from the surface of the resin mold, it is possible to mount the semiconductor device 11 freely in a direction from either its front or rear surface side on a circuit board 29 in which an interconnection pattern 28 is formed on an insulating substrate 27, as shown in FIGS. 6 and 7.

Upon soldering, since the side surface 15c of the terminal portion 15 is exposed, solder 30 swells above the side surface 15c so that the soldering property is improved.

FIG. 6 shows the resin mold type semiconductor device according to a second embodiment of the present invention. In this embodiment, the semiconductor device 11 is arranged such that the rear surface 13a of the semiconductor chip 13 is exposed to the outside. Therefore, in this embodiment, if the semiconductor device 11 is mounted such that the exposed rear surface 13a of the semiconductor chip 13 comes upside as shown in FIG. 6, the heat radiation property of the semiconductor chip 13 is improved.

FIG. 7 shows the resin mold type semiconductor device according to a third embodiment of the present invention. As in this embodiment, when the semiconductor device 11 is mounted such that the exposed rear surface 13a of the semiconductor chip 13 comes downside as shown in FIG. 7, if an opening 31 opposing the semiconductor device 11 is provided through the circuit board 29, the heat radiation property of the semiconductor chip 13 is improved.

Figure 8:
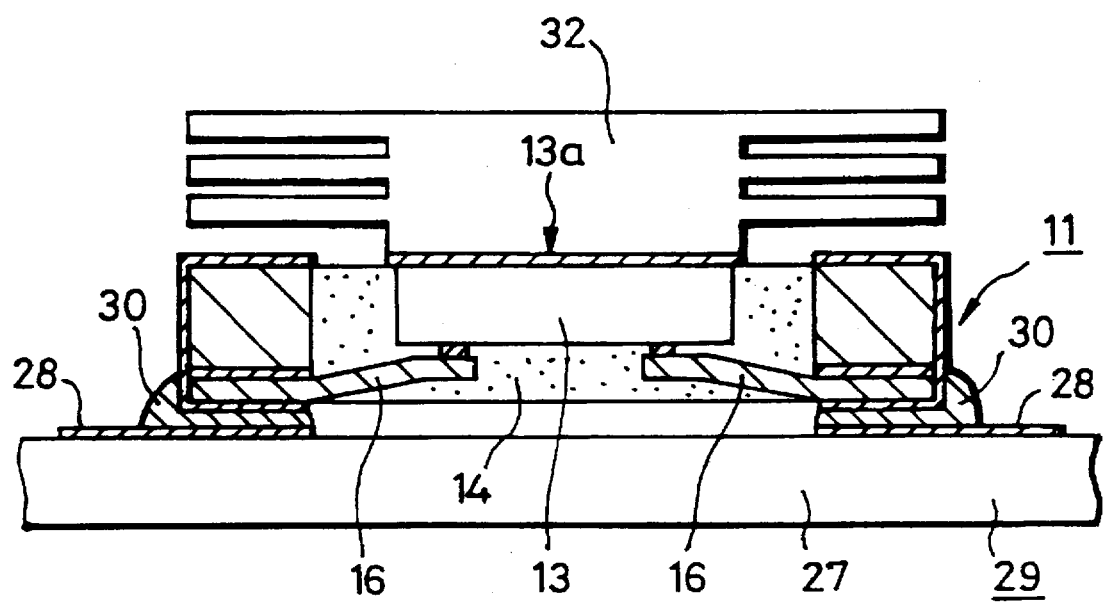
FIG. 8 is a cross-sectional view of the resin mold type semiconductor device according to a fourth embodiment of the present invention, and to which reference will be made in explaining how to mount the resin mold type semiconductor device on the circuit board.

FIG. 8 shows the resin mold type semiconductor device according to a fourth embodiment of the present invention. In this embodiment, a heat sink 32 is provided on the exposed rear surface 13a of the semiconductor chip 13 as shown in FIG. 8, so that the heat radiation property of the semiconductor chip 13 is further improved.

Figure 9:
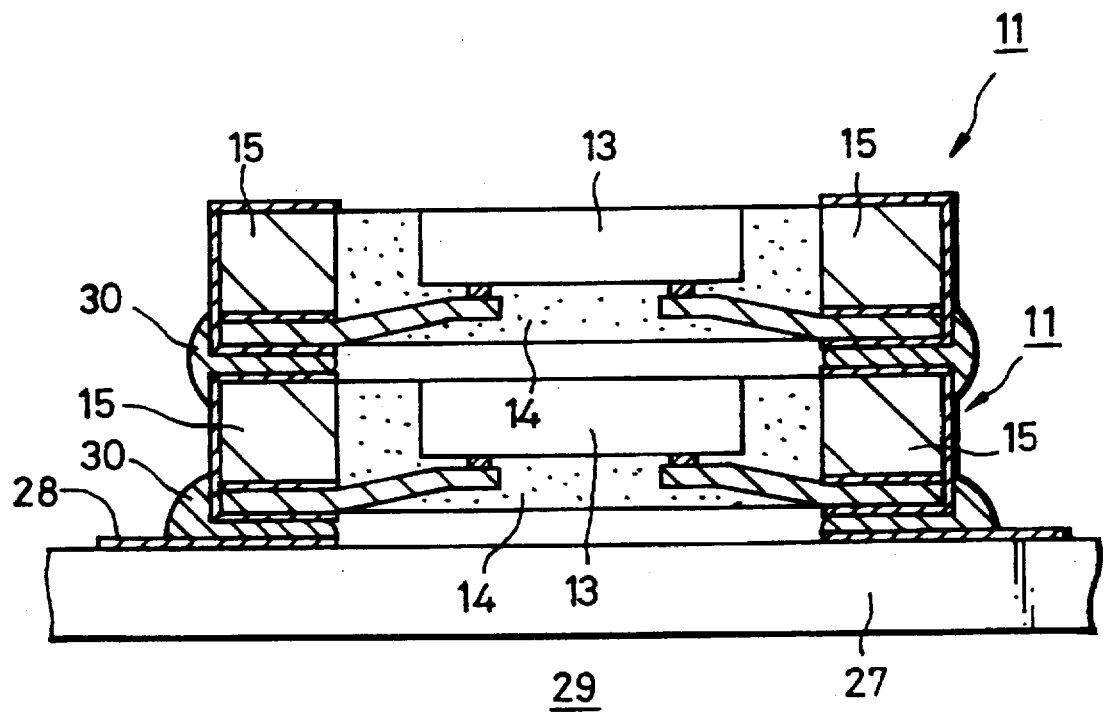
FIG. 9 is a cross-sectional view of the resin mold type semiconductor device according to a fifth embodiment of the present invention, and to which reference will be made in explaining how to mount the resin mold type semiconductor device on the circuit board.

FIG. 9 shows the resin mold type semiconductor device according to a fifth embodiment of the present invention. In this embodiment, as shown in FIG. 9, a plurality of semiconductor devices 11 can be laminated and mounded on the circuit board 29 such that the corresponding terminal portions 15 of the semiconductor devices 11 are soldered directly to each other. This mounting method may be applied to, for example, a semiconductor memory or the like.

Figure 10:
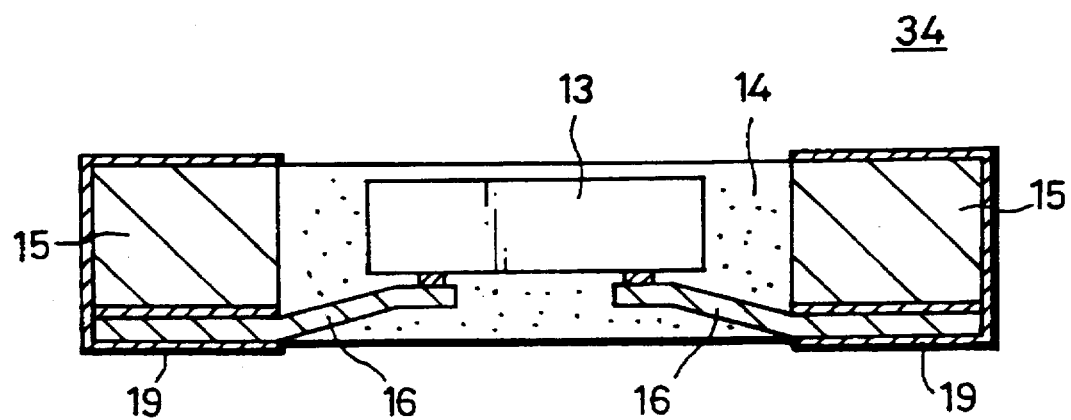
FIG. 10 is a cross-sectional view of the resin mold type semiconductor device according to a sixth embodiment of the present invention.

FIG. 10 shows the resin mold type semiconductor device according to a sixth embodiment of the present invention. In this embodiment, a resin mold type semiconductor device 34 is arranged so that the semiconductor chip 13 is disposed within a range of the thickness of the terminal portions 15 so as to be completely buried within the mold resin 14. Also in this embodiment, similarly to the aforesaid embodiments, it is possible to obtain an ultra thin, small-sized resin mold type semiconductor device. Further, the semiconductor device 34 can be mounted freely in the direction from either its front or rear surface side on the circuit board 29. Furthermore, a plurality of the semiconductor devices 34 can be laminated and mounted on the circuit board 29.

As set out above, according to the present invention, it is possible to obtain the ultra thin, small-sized resin mold type semiconductor device. It is also possible to mount the semiconductor device with free selection of the mounting direction from either its front or rear surface side on the circuit board. Further, a plurality of semiconductor devices can be laminated easily so that it is possible to increase the freedom with which the resin mold type semiconductor device is mounted on the circuit board.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A resin mold type semiconductor device comprising:
   a semiconductor chip; and
   a lead frame, said semiconductor chip having a thickness which is less than a thickness of said lead frame and being sealed with resin mold;
   said lead frame having at least one conductor with a terminal portion external to said semiconductor device and extending to a location adjacent said chip;
   said chip being supported in said frame only by said conductors and said resin mold and further wherein a surface of the chip is flush with a surface of the resin.

2. A resin mold type semiconductor device according to claim 1, wherein a thickness of said semiconductor device is defined by the thickness of said lead frame.

3. A resin mold type semiconductor device according to claim 2, wherein an upper surface, a lower surface and a side surface of said terminal portion formed by said lead frame are exposed from the surface of said resin mold.

4. A resin mold type semiconductor device according to claim 2 wherein said semiconductor chip is interconnected to a connection lead portion of said conductor which is led out integrally from said terminal portion and which is thinner than said terminal portion.

5. A resin mold type semiconductor device according to claim 1, wherein an upper surface, a lower surface and a side surface of said terminal portion formed by said lead frame are exposed from the surface of said resin mold.

6. A resin mold type semiconductor device according to claim 5 wherein said semiconductor chip is interconnected to a connection lead portion of said conductor which is led out integrally from said terminal portion and which is thinner than said terminal portion.

7. A resin mold type semiconductor device according to claim 1, wherein said semiconductor chip is interconnected to a connection lead portion of said conductor which is led out integrally from said terminal portion and which is thinner than said terminal portion.

8. A resin mold type semiconductor device according to claim 1, wherein a heat sink is attached to an exposed surface of the semiconductor chip.

9. A resin mold type semiconductor device according to claim 1, wherein a second resin mold type semiconductor device having a plurality of leads is secured above an exposed surface of the chip and wherein a plurality of leads from the second resin mold type semiconductor device are connected to corresponding leads of the semiconductor chip.

10. A resin mold semiconductor device comprising:

at least one outer conductive lead formed as a three-dimensional substantially rectangular body having a thickness;

an inner lead having a first portion in contact with a first surface of the outer conductive lead and a second portion extending inward toward a semiconductor chip, said second portion also bending up from the first surface of the outer conductive lead and wherein a thickness of the semiconductor chip is less than a thickness of the outer conductive lead.

11. The resin molded semiconductor device of claim 10, further comprising resin surrounding said semiconductor chip.

12. The resin molded semiconductor device of claim 10, wherein resin surrounds all but one side of the semiconductor chip.

13. The resin molded semiconductor device of claim 12 wherein a heat sink is attached to an exposed surface of the semiconductor chip.

14. A resin mold type semiconductor device according to claim 12, wherein a second resin mold type semiconductor device having a plurality of leads is secured above an exposed surface of the chip and wherein a plurality of leads from the second resin mold type semiconductor device are connected to corresponding leads of the semiconductor chip.

15. A resin mold semiconductor device comprising:

at least one outer conductive lead formed as a three-dimensional substantially rectangular body having a first thickness;

an inner lead having a first portion in contact with a first surface of the outer conductive lead and a second portion extending inward toward a semiconductor chip, and wherein a thickness of the semiconductor chip is less than a combination of the first thickness and a thickness of the inner lead.

16. The semiconductor device of claim 15, wherein a thickness of the semiconductor chip is less than the first thickness.

* * * * *